(12) United States Patent
Futamura (10) Patent No.: US 6,753,558 B2
(45) Date of Patent: Jun. 22, 2004

(54) SOLID STATE IMAGE SENSOR (75) Inventor: Fumiaki Futamura, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/424,703

(22) Filed: Apr. 28, 2003

(65) Prior Publication Data

US 2003/0209744 A1 Nov. 13, 2003

(30) Foreign Application Priority Data

May 7, 2002 (JP) ........................................ 2002-131478

(51) Int. Cl.⁷ ............................................. H01L 27/148
(52) U.S. Cl. ...................... 257/233; 257/234; 257/226; 257/222; 257/72
(58) Field of Search ............................ 257/72, 222–233

Primary Examiner—Fetsum Abraham
(74) Attorney, Agent, or Firm—Scully, Scott, Murphy & Presser (57) ABSTRACT

A solid state image sensor is constructed such that a plurality of linear image sensors are provided to have at least one row of photodiodes in each of the plurality of linear image sensors and a photodiode array is formed by arranging the plurality of linear image sensors side by side. A control gate electrode used to retrieve electric charges and a polysilicon electrode serving as a charge transfer electrode are provided between the pluraliielding conductive film is provided on the polysilicon electrode to partition the plurality of linear image sensors into individual linear image sensors. Accordingly, a light beam incident on a certain linear image sensor can be prevented from entering another linear image sensor adjacent to the certain linear image sensor, thereby reducing a difference between the amounts of signal charges outputted from different linear image sensors and suppressing smear.

5 Claims, 14 Drawing Sheets

SOLID STATE IMAGE SENSOR

BACKGROUND OF THE INVENTION

1. Field of the Invention

The present invention relates to a structure of a solid state image sensor, and particularly to a solid state image sensor in which smear reduction is effected to an optimum extent.

2. Description of the Related Art

Typically, a color image sensor is configured to have three rows of CCD (Charge Coupled Device) linear image sensors arranged therein in parallel with one another, each row including a CCD and having a function of transferring electric charges, and to form a color filter including, for example, a red color filter, a green color filter and a blue color filter, and corresponding to a color different from other colors on each of photodiodes of each of the three rows of linear image sensors.

Figure 1:
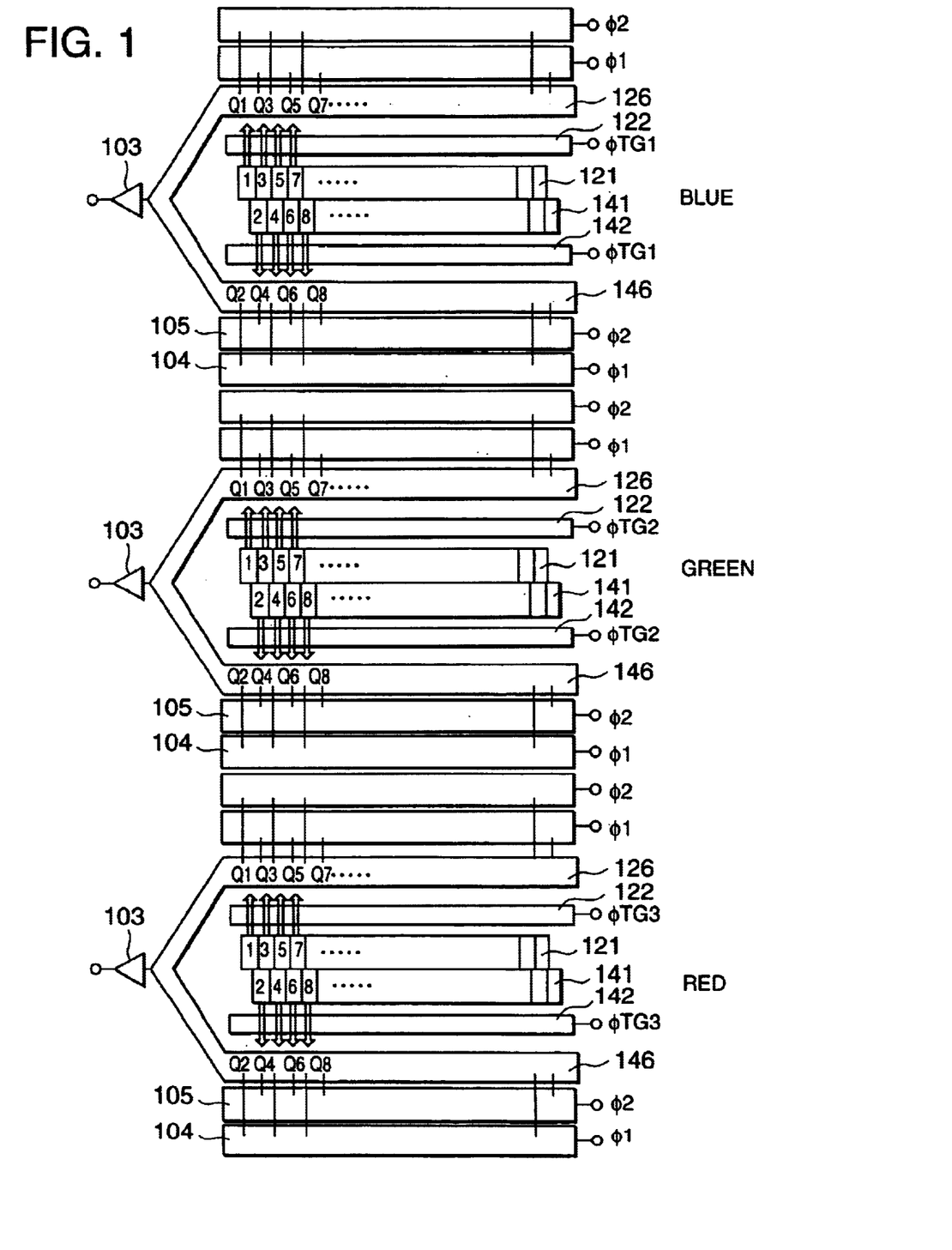
FIG. 1 is the entire configuration of an exemplified color linear image sensor.

FIG. 1 illustrates the entire configuration of an exemplified color image sensor having the aforementioned construction. The image sensor includes: two rows of photodiodes 121, 141, each photodiode of the row having a color filter (not shown) thereon consisting of one of a red (R) color filter, a green (G) color filter and a blue (B) color filter; and control gates 122, 142 for retrieving signal charges photo-electrically converted within a photodiode from the photodiode for transfer of the signal charges to charge transfer registers 126, 146. Thus, signal charges Q1, Q2, Q3, Q4 . . . are retrieved and supplied to the charge transfer registers 126, 146 (denoted by a white arrow in the figure). Readout pulses $\phi_{TG1}$, $\phi_{TG2}$ and $\phi_{TG3}$ (bus lines are not shown for simplification) for retrieving signal charges are applied to the control gates 122, 142. The charge transfer registers 126, 146 each include two-phase CCD registers, and signals $\phi_1$ and $\phi_2$ are applied to the charge transfer registers 126 and 146, respectively (pulse lines are not shown). The signal charges transferred through the charge transfer registers 126, 146 are transferred to a floating diffusion region. The signal charges transferred to the floating diffusion region are converted to a signal voltage through a charge detector. The signal voltage obtained by conversion of the signal charges is outputted as a color signal from an output circuit 103 including an analog circuit such as a source follower, inverter or the like to the outside.

Figure 2:
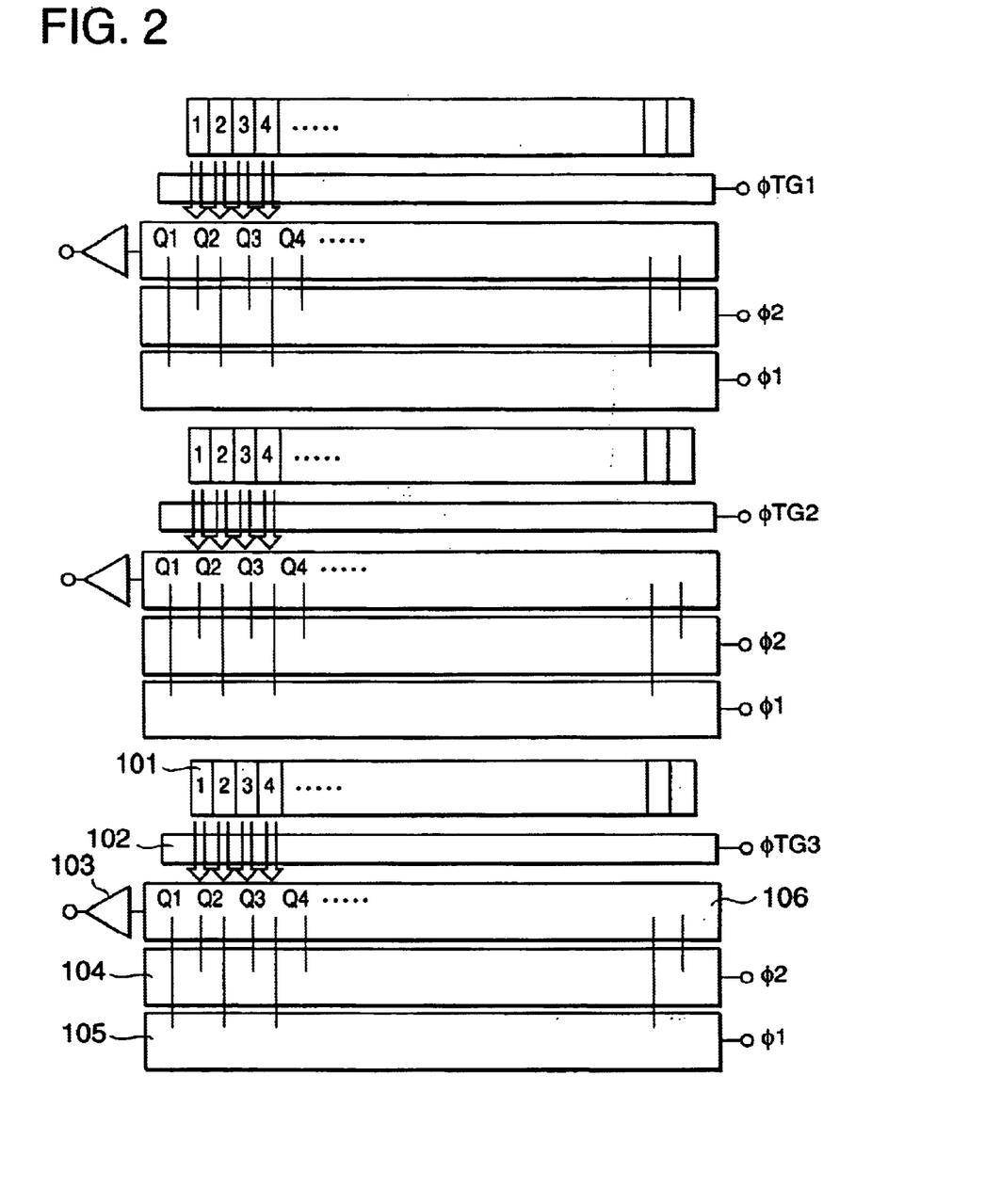
FIG. 2 is a plan view of a color image sensor having CCD linear image sensors, each linear image sensor including a single row of photodiodes and corresponding to an individual color, and configured to retrieve electric charges only from one side of the row of photodiodes.

FIG. 2 is a plan view of a color image sensor having CCD linear image sensors, each linear image sensor including a single row of photodiodes and corresponding to an individual color, and configured to retrieve electric charges only from one side of the row of photodiodes. The configuration of CCD linear image sensor other than the aforementioned configuration is the same as that shown in FIG. 1.

In recent years, need for high resolution and high integration density enhances reduction in pixel size. For this reason, a solid state image sensor incorporating a plurality of CCD linear image sensors, each linear image sensor having two rows of photodiodes, which are alternately arranged at an interval of half the pixel size in a direction of the row, potentially introduces a light beam incident on the photodiode in one row through an opening for the photodiode into another photodiode in the other row. When the aforementioned phenomenon occurs, a difference between the amounts of signal charges from different rows of photodiodes is caused even if the same amount of a light beam is irradiated on each of the two rows of photodiodes.

Figure 3:
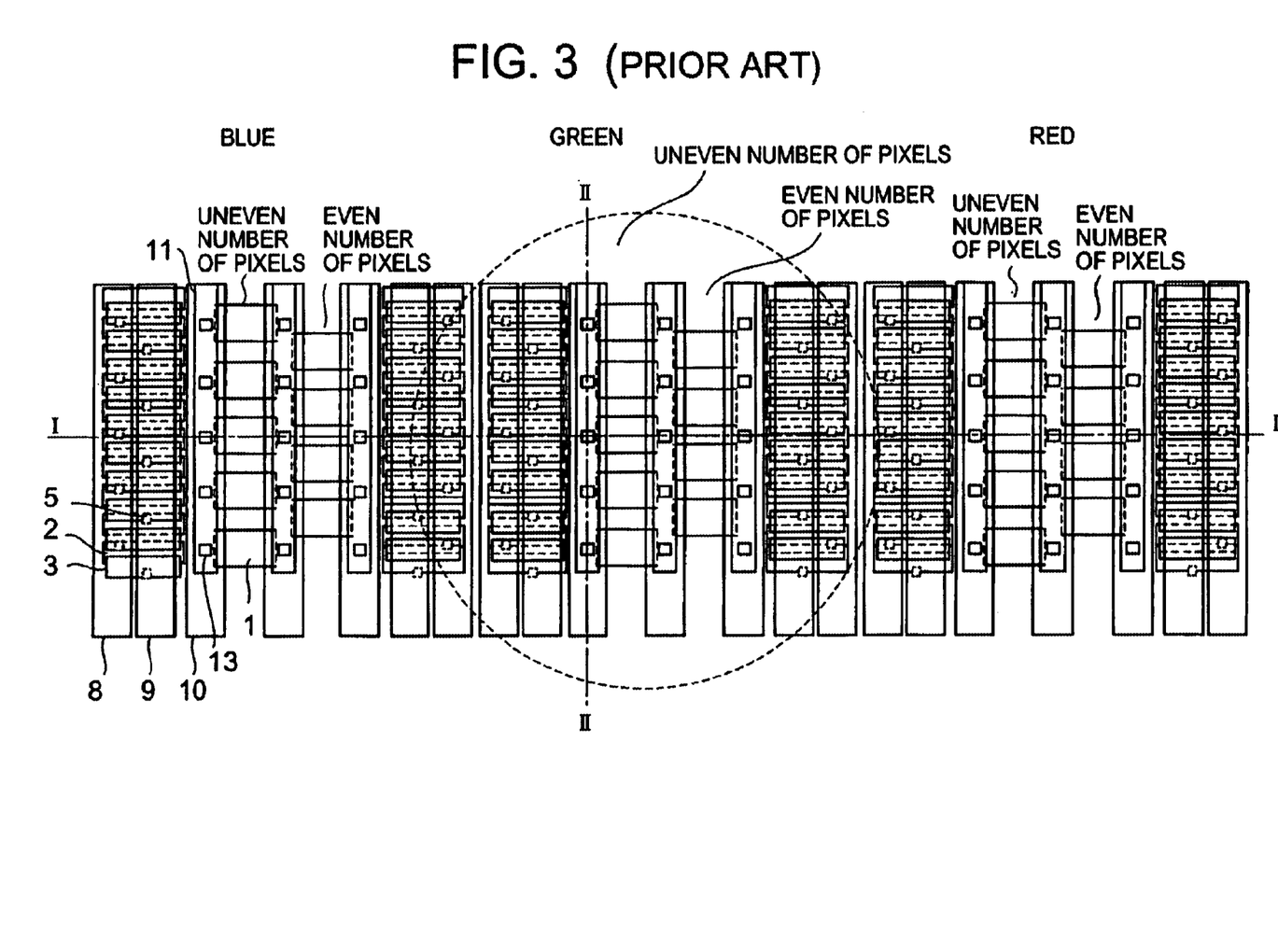
FIG. 3 is a plan view of a conventional solid state image sensor.
Figure 4:
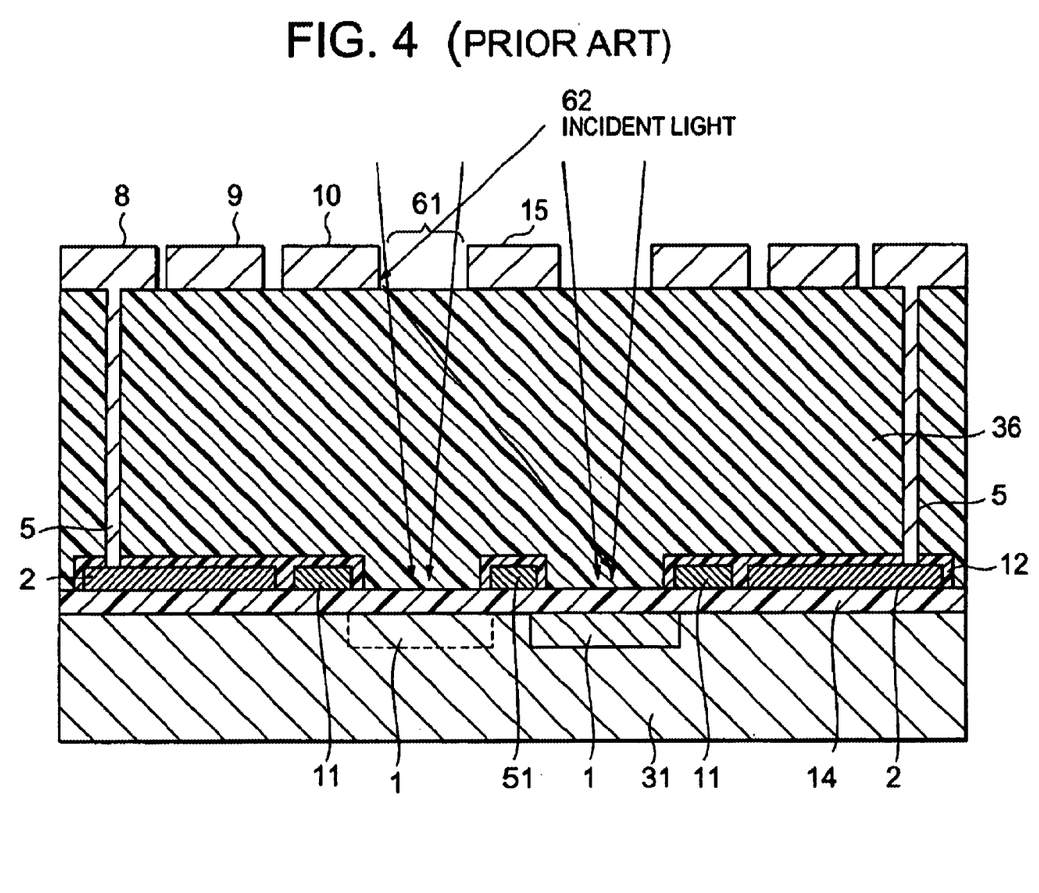
FIG. 4 is an enlarged cross sectional view of the solid state image sensor, taken along the line I—I of FIG. 3 and corresponding to a portion, enclosed by a dashed circle line, of the drawing of FIG. 3.

FIG. 3 is a plan view of a conventional solid state image sensor. FIG. 4 is an enlarged cross sectional view of the solid state image sensor, taken along the line I—I of FIG. 3 and corresponding to a portion, enclosed by a dashed circle line, of the drawing of FIG. 3. FIG. 4 illustrates an enlarged view of a photodiode for photo-electrically converting a light beam incident thereon and a charge transfer register for transferring electric charges generated within the photodiode by photo-electric conversion. Though not clearly shown in the plan view of the entire solid state image sensor of FIG. 3, a boundary between photodiodes in a longitudinal direction (i.e., a direction of the row of photodiodes) includes boron ions implanted thereinto so that electric charges produced within a certain photodiode by photo-electric conversion are not able to enter a photodiode adjacent to the certain photodiode. In the figure, a color filter is also omitted for simplification.

As shown in FIG. 4, when viewing the paper from a direction vertical to the paper, a light beam 62 incoming through an opening 61 corresponding to a photodiode 1 on the left should typically be photo-electrically converted within the photodiode 1 (denoted by a dashed line) on the left. However, the light beam 62 incident on the opening 61 from a direction inclined relative to the normal to the opening 61 is reflected by an interconnect line 10 serving also as a light shielding material and then passes through an interlayer insulation film 36 between through holes 5, and finally enters the photodiode 1 on the right, producing a difference between the amounts of electric charges generated within the photodiodes on the adjacent rows of photodiodes.

Figure 5:
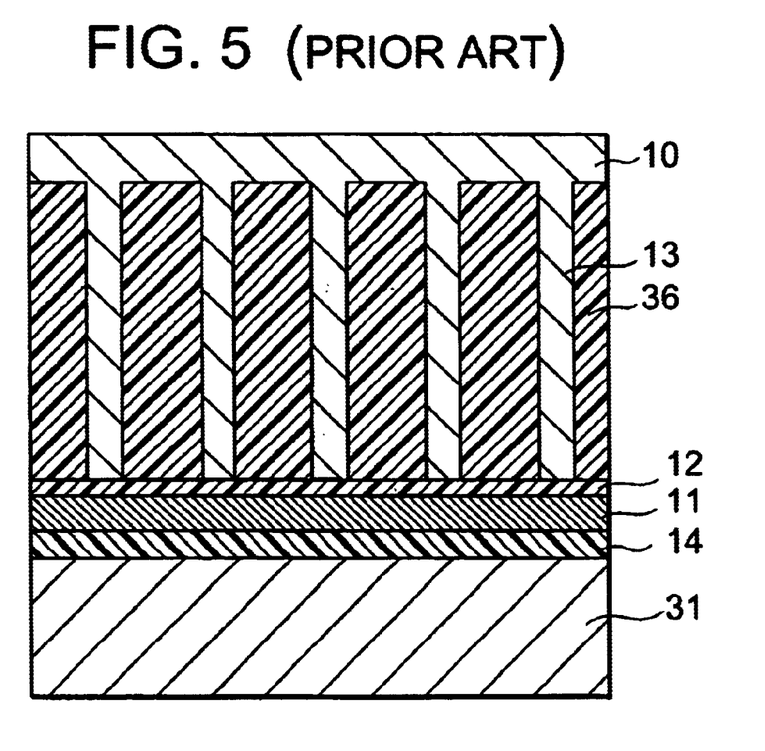
FIG. 5 is an enlarged cross sectional view of the solid state image sensor, taken along the line II—II of FIG. 3 and corresponding to a portion, enclosed by a dashed circle line, of the drawing of FIG. 3.

FIG. 5 is an enlarged cross sectional view of the solid state image sensor, taken along the line II—II of FIG. 3 and corresponding to a portion, enclosed by a dashed circle line, of the drawing of FIG. 3. As shown in FIG. 5, a second polysilicon electrode 11 used to retrieve signal charges and the interconnect line 10 are connected to each other through an opening 13 provided in the interlayer insulation film 36. However, the interconnect line 10 is only filled within the opening 13 and is not configured to penetrate the interlayer insulation film 36 in the form of a one-piece conductive plate in a direction of the row. Accordingly, the light beam 62 incident on the photodiode 1 from a direction inclined relative to the normal to the photodiode 1 enters also a first polysilicon electrode 2 as a charge transfer electrode through the interlayer insulation film 36 between the openings 13. In this case, the light beam entering the first polysilicon electrode 2 probably permeates through defects or the like in the charge transfer electrode and then impinges on a charge transfer channel beneath the charge transfer electrode.

Figure 6:
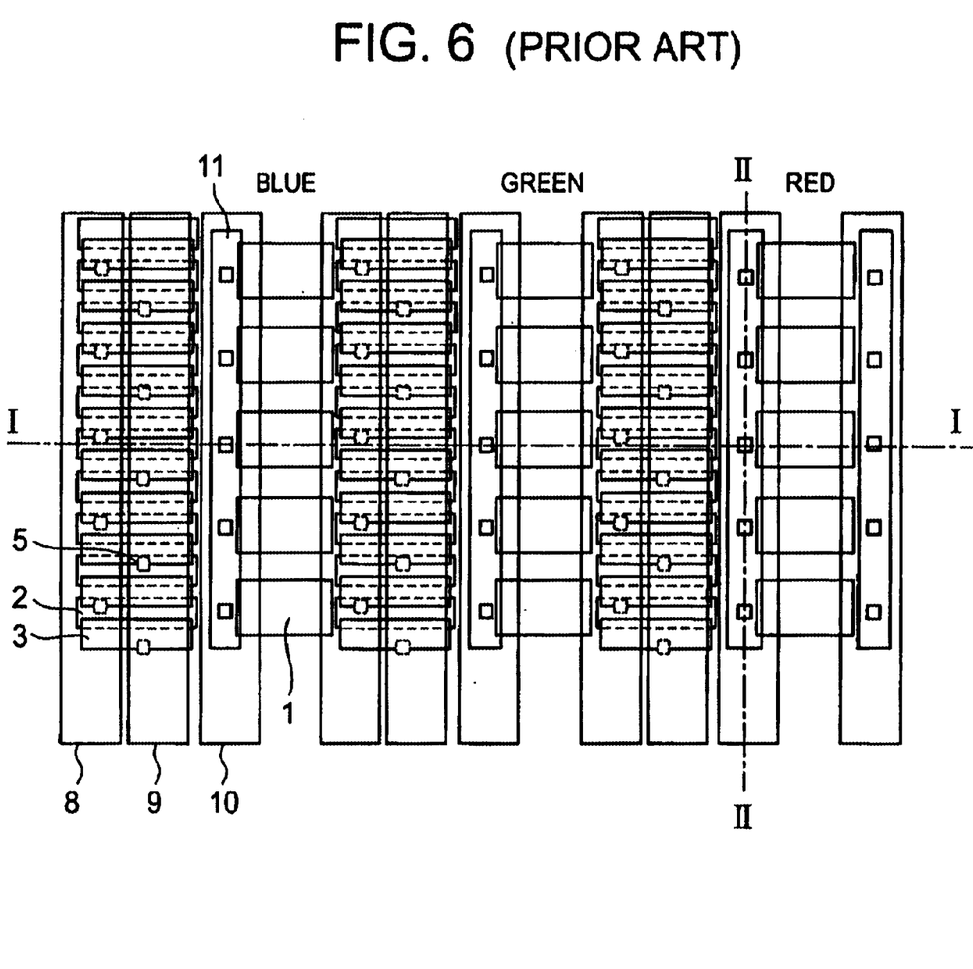
FIG. 6 is a plan view of the solid state image sensor including a plurality of CCD linear image sensors, each linear image sensor having a single row of photodiodes.
Figure 7:
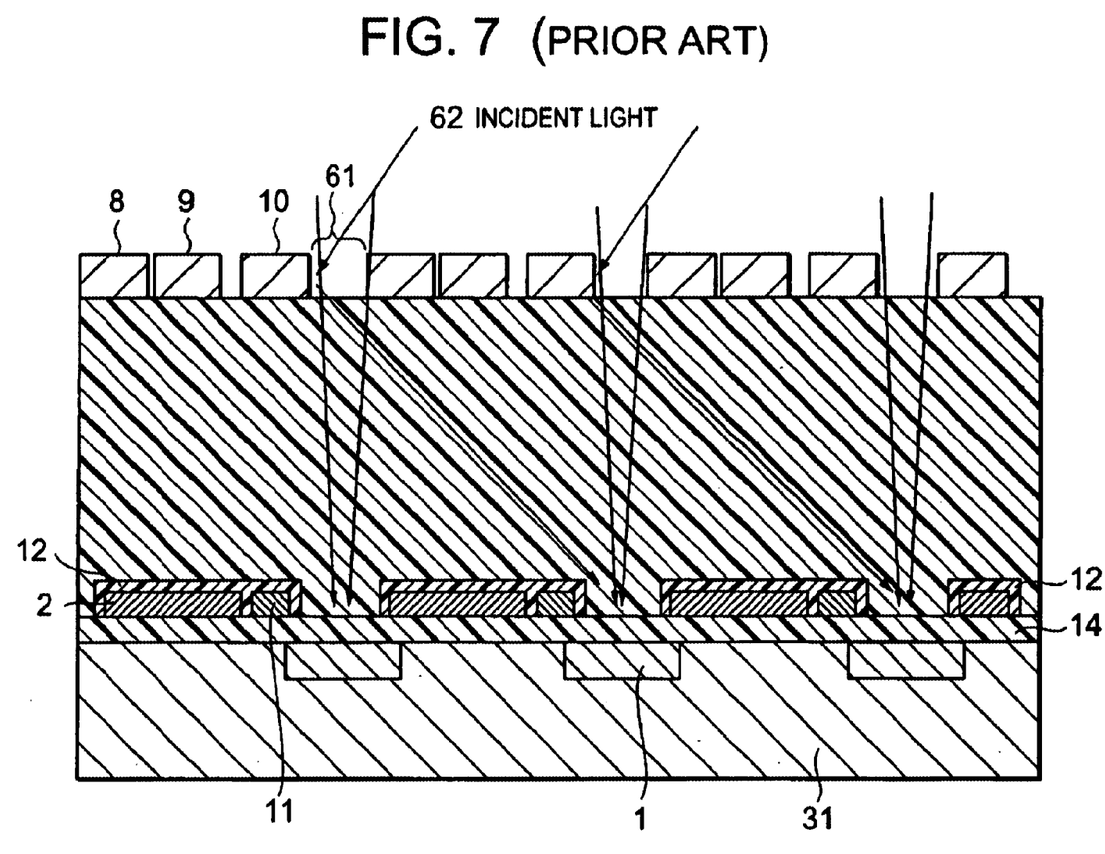
FIG. 7 is an enlarged cross sectional view of the device, taken along the line I—I of FIG. 6 and corresponding to a portion, enclosed by a dashed circle line, of the drawing of FIG. 6.
Figure 8:
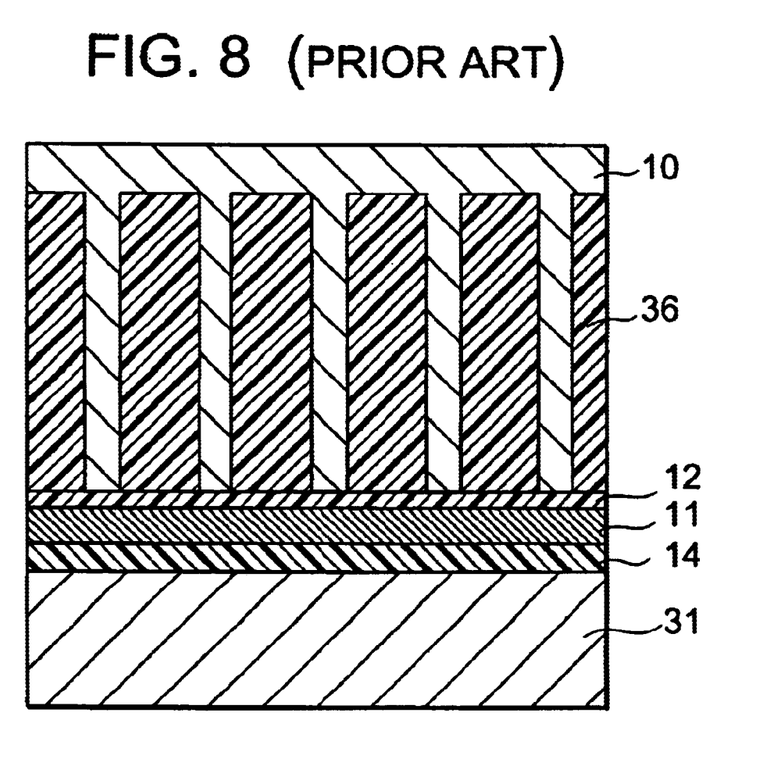
FIG. 8 is an enlarged cross sectional view of the device, taken along the line II—II of FIG. 6.

A solid state image sensor incorporating a plurality of CCD linear image sensors, each linear image sensor having a single row, corresponding to one color, of photodiodes, is shown in FIGS. 6 through 8. FIG. 6 is a plan view of the solid state image sensor including a plurality of CCD linear image sensors, each linear image sensor having a single row of photodiodes, and FIG. 7 is an enlarged cross sectional view of the solid state image sensor, taken along the line I—I of FIG. 6 and corresponding to a portion, enclosed by a dashed circle line, of the drawing of FIG. 6, and FIG. 8 is an enlarged cross sectional view of the solid state image sensor, taken along the line II—II of FIG. 6. In the solid state image sensor of the type described above, as shown in FIGS. 7, 8, a light beam 62 incoming from a direction inclined relative to the normal to a photodiode 1 on the left is reflected by an interconnect line 10 serving also as a light shielding material and passes through an interlayer insulation film 36 between through holes 6, and finally enters the photodiode 1 on the right, producing electric charges within the photodiode 1 on the right. The electric charge thus produced causes a difference between the amounts of electric charges generated within the photodiodes in the rows of photodiodes corresponding to the individual CCD linear image sensors, causing a difference between the amplitudes of output signals, i.e., causing smear.

SUMMARY OF THE INVENTION

The present invention is directed to a solid state image sensor incorporating a plurality of CCD linear image sensors, each linear image sensor having a single row or two rows of photodiodes, and being capable of reducing a difference between outputs from the plurality of linear image sensors and thereby reducing smear.

A solid state image sensor of the present invention includes: a linear image sensor having at least one row of photodiodes; a photodiode array formed such that the linear image sensor constitutes a plurality of linear image sensors, and the plurality of linear image sensors are arranged side by side; an insulation film covering the photodiode array; and a light shielding conductive film formed to penetrate the insulation film in a direction of thickness of the insulation film and partition the plurality of linear image sensors into individual linear image sensors, the light shielding conductive film serving as a light shielding film.

The solid state image sensor of the present invention further includes a charge transfer register disposed beside the at least one row of photodiodes and corresponding to the at least one row of photodiodes, in which the light shielding conductive film serves as a wall to separate the at least one row of photodiodes and the charge transfer register from each other.

The solid state image sensor of the present invention is further constructed such that the plurality of linear image sensors arranged in the photodiode array are provided to correspond to individual colors to be displayed.

DETAILED DESCRIPTION OF THE PREFERRED EMBODIMENTS

A first embodiment of the present invention will be explained with reference to FIGS. 9 through 11.

In the first embodiment of the present invention, a solid state image sensor incorporating a plurality of linear image sensors, each linear image sensor having two rows of photodiodes, and configured to have the photodiodes in the two rows alternately arranged at an interval of half the pixel size in a direction of the row, will be explained below. FIG. 9 is a plan view of the solid state image sensor. FIG. 10 is an enlarged cross sectional view of the device, taken along the line I—I of FIG. 9 and corresponding to a portion, enclosed by a dashed circle line, of the drawing of FIG. 9. FIG. 11 is a cross sectional view taken along the line II—II of FIG. 9. In the depiction of the cross-sectional view, to high light positional relationship between a light beam incident on a photodiode and the photodiode, diffusion layers other than a photodiode and a charge transfer register are omitted and a portion of the solid state image sensor positioned above the surface of a semiconductor substrate is primarily depicted. Furthermore, though not depicted in the figures, the solid state image sensor is configured to have a boundary implanted with boron ions and positioned between photodiodes 1 so that electric charges generated within a certain photodiode by photo-electric conversion are not able to enter a photodiode adjacent to the certain photodiode. Additionally, color filters having one color different from other colors are formed so as to correspond to each row of the plurality of linear image sensors.

Figure 9:
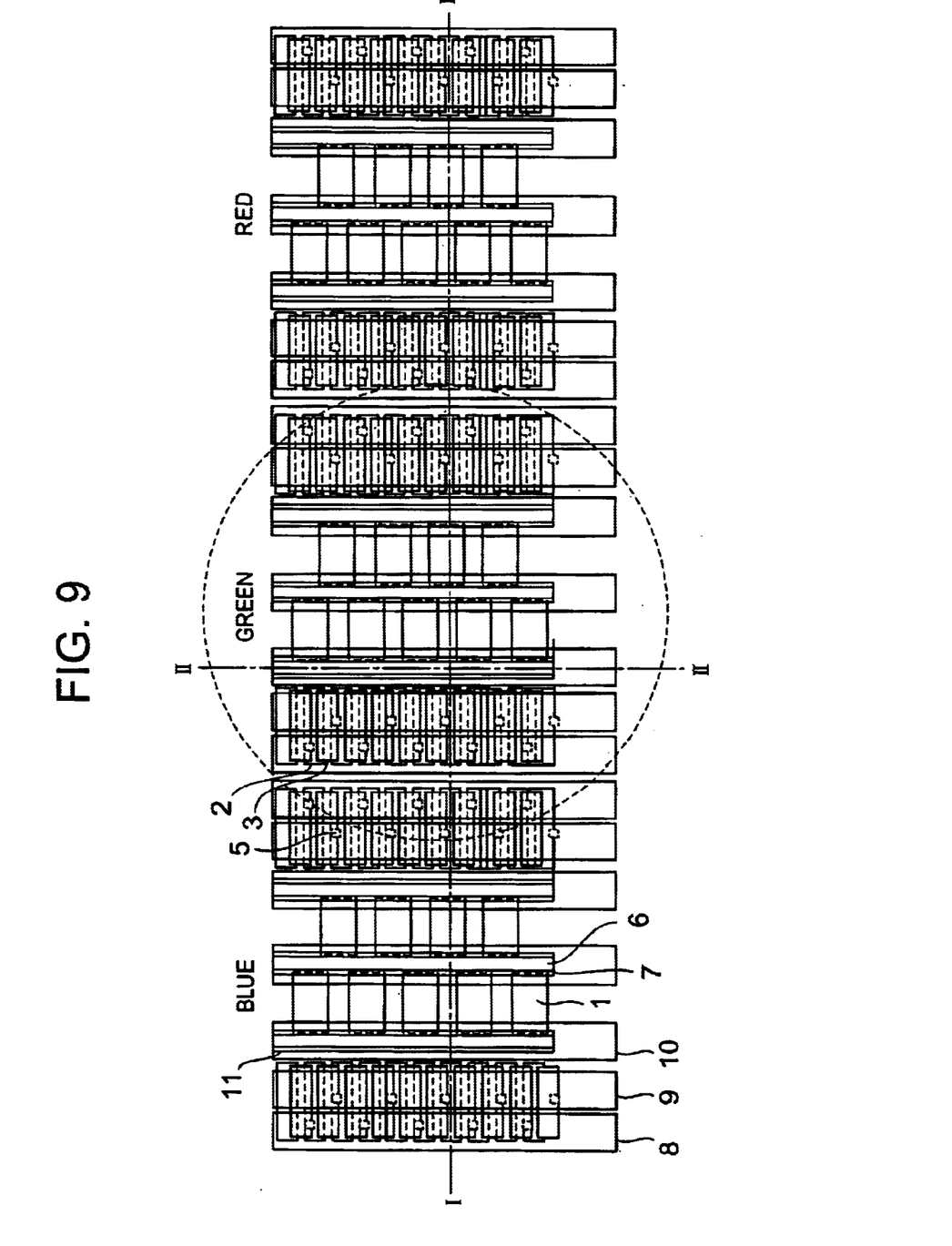
FIG. 9 is a plan view of a solid state image sensor according to a first embodiment of the invention.

The solid state image sensor shown in FIG. 9 is configured to have two rows of photodiodes provided so that the photodiodes in the two rows are alternately arranged at an interval of half the pixel size in a direction of the row. The two rows of photodiodes arranged as described above enable the solid state image sensor to have an pixel area (area for receiving a light beam) larger than that obtained employing the solid state image sensor configured to include a plurality of linear image sensors, each linear image sensor having a single row of photodiodes arranged in a direction of the row, and to thereby have high sensitivity of light and output a signal having a high S/N ratio. In this case, since the photodiodes are arranged in two rows, electric charges generated within the photodiodes by photo-electrical conversion are retrieved from both sides of the linear image sensor.

Figure 10:
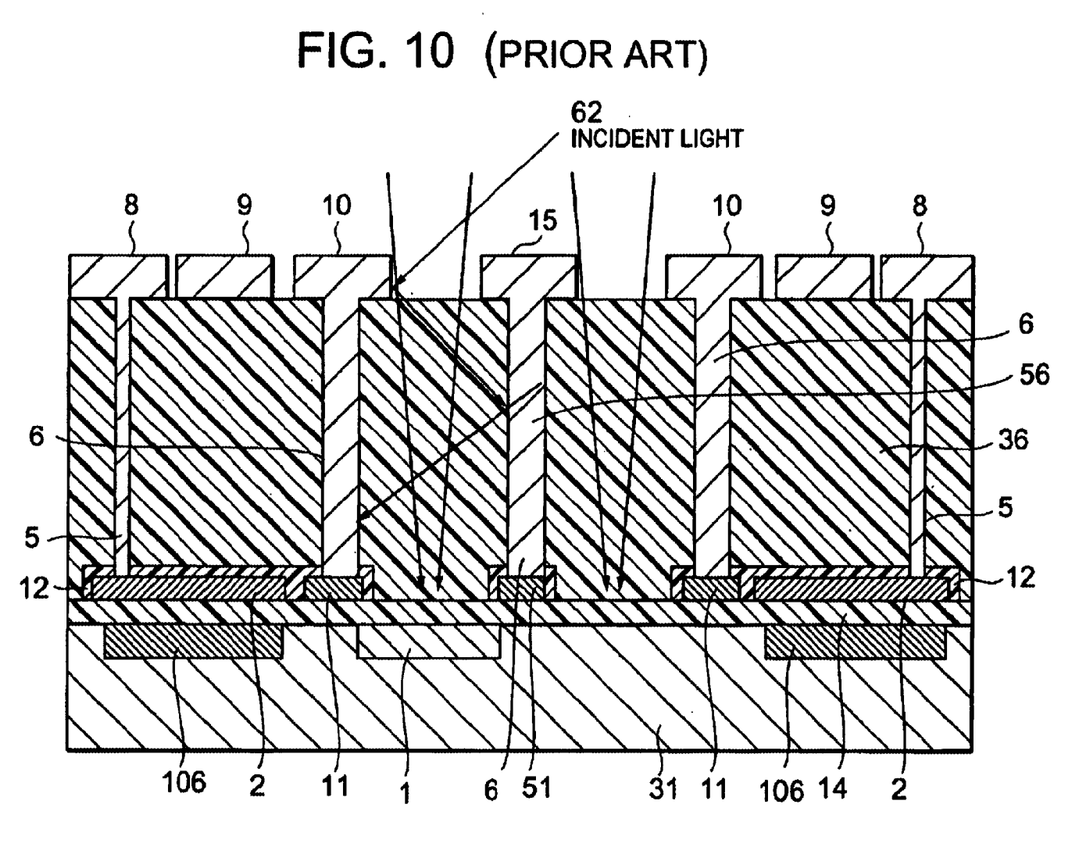
FIG. 10 is an enlarged cross sectional view taken along the line I—I of FIG. 9 and corresponding to a portion, enclosed by a dashed circle line, of the drawing of FIG. 9.
Figure 11:
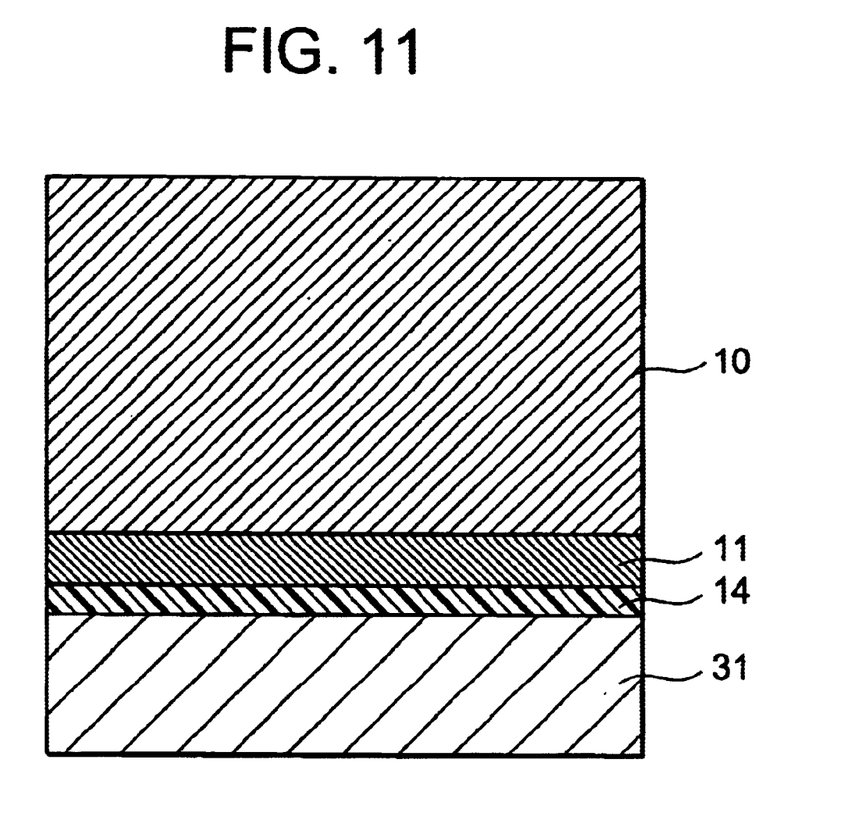
FIG. 11 is a cross sectional view taken along the line II—II of FIG. 9.

As shown in FIG. 10, the two rows of photodiodes 1 are arranged adjacent to each other in a semiconductor substrate 31, and a charge transfer channel 106 is formed beside one of the two rows of photodiodes 1 so as to correspond thereto. An oxide film 14 is formed on a surface of the semiconductor substrate 31. A first polysilicon electrode 2 and a second polysilicon electrode 3 (refer to FIG. 9) are formed on the oxide film 14 on the charge transfer channel 106. Furthermore, a second polysilicon electrode 3 used to retrieve electric charges generated within the photodiode 1 is formed between the photodiode 1 and the charge transfer channel 106. The second polysilicon electrode is also formed as a light-shielding-cum-connection electrode 51 between the two adjacent rows of photodiodes 1. The light-shielding-cum-connection electrode 51 is connected to, for example, a ground GND. The first polysilicon electrode 2 and the second polysilicon electrode 11 formed above the charge transfer channel 106 are isolated from each other by an interlayer insulation film 12 for isolation of polysilicon layers.

An interlayer insulation film 36 is formed covering the first polysilicon electrode 2, the second polysilicon electrode 11 and the light-shielding-cum-connection electrode 51 formed as described above, and openings 5, 6 and 56 are formed in the interlayer insulation film 36 by opening the corresponding portions of the film 36 on the first polysilicon electrode 2, the second polysilicon electrode 11 and the light-shielding-cum-connection electrode 51. Note that the openings 6, 56 are formed in parallel with the two rows of photodiodes 1 disposed next to the openings and provided in the form of a one-piece opening. The opening 5 is formed on the first polysilicon electrode 2 above the charge transfer channel 106 (also on the second polysilicon electrode 11 above the charge transfer channel 106).

The openings 5, 6 and 56 formed as described above are filled with a light shielding metal to form light shielding electrodes 8, 10 and 15 (the opening 5 formed above the second polysilicon electrode 11 above the charge transfer channel 106 is a light shielding electrode 9) made of, for example, aluminum, which electrodes are extended on the interlayer insulation film 36 to also serve as an interconnect line on the film 36. The light shielding electrode 15 is formed in the interlayer insulation film 36 between the two rows of photodiodes 1 so as to penetrate the interlayer insulation film 36 in a direction of film thickness. Furthermore, the light shielding electrode 10 is formed in the interlayer insulation film 36 between the row of photodiodes 1 and the charge transfer channel 106 corresponding thereto so as to penetrate the interlayer insulation film 36 in a direction of film thickness. Thus, the light shielding electrodes on both sides of the row of photodiodes completely sandwich the interlayer insulation film on the row of photodiodes, except for the upper and lower surfaces of the interlayer insulation film. The result of the light shielding electrodes sandwiching the row of photodiodes is illustrated in FIG. 11. FIG. 11 is a cross sectional view taken along the line II—II of FIG. 9 and as can be seen from FIG. 11, the light shielding electrode 10 is formed filling the opening 6 and provided along the opening 6 in a direction of the row on the second polysilicon electrode 11.

In this case, the light shielding electrode 15 serves as a light shielding wall that prevents a light beam incident on the photodiode 1 from entering another photodiode adjacent to the photodiode 1. The light shielding electrode 10 serves as a light shielding wall that prevents a light beam incident on the photodiode 1 from entering the charge transfer channel 106 correspond to the photodiode 1. The light shielding electrode 10 also prevents a light beam incident on the two rows of photodiodes 1 corresponding to one color from entering adjacent two rows of photodiodes 1 positioned next to the two rows of photodiodes 1 and corresponding to another color different from the one color. Needless to say, contrary to the aforementioned case, the light shielding electrode 10 prevents a light beam incident on the adjacent two rows of photodiodes 1 corresponding to another color from entering the two rows of photodiodes 1 positioned next to the adjacent two rows of photodiodes 1 and corresponding to the one color.

Moreover, in the first embodiment, although the charge transfer electrode of the charge transfer register is formed from two polysilicon layers, it may be formed from a single polysilicon layer and further, a material making up the charge transfer electrode is not limited to that employed in the embodiment. Likewise, a material making up the light shielding electrode is not limited to aluminum formed within the contact hole, but may be a metal other than aluminum.

Figure 12:
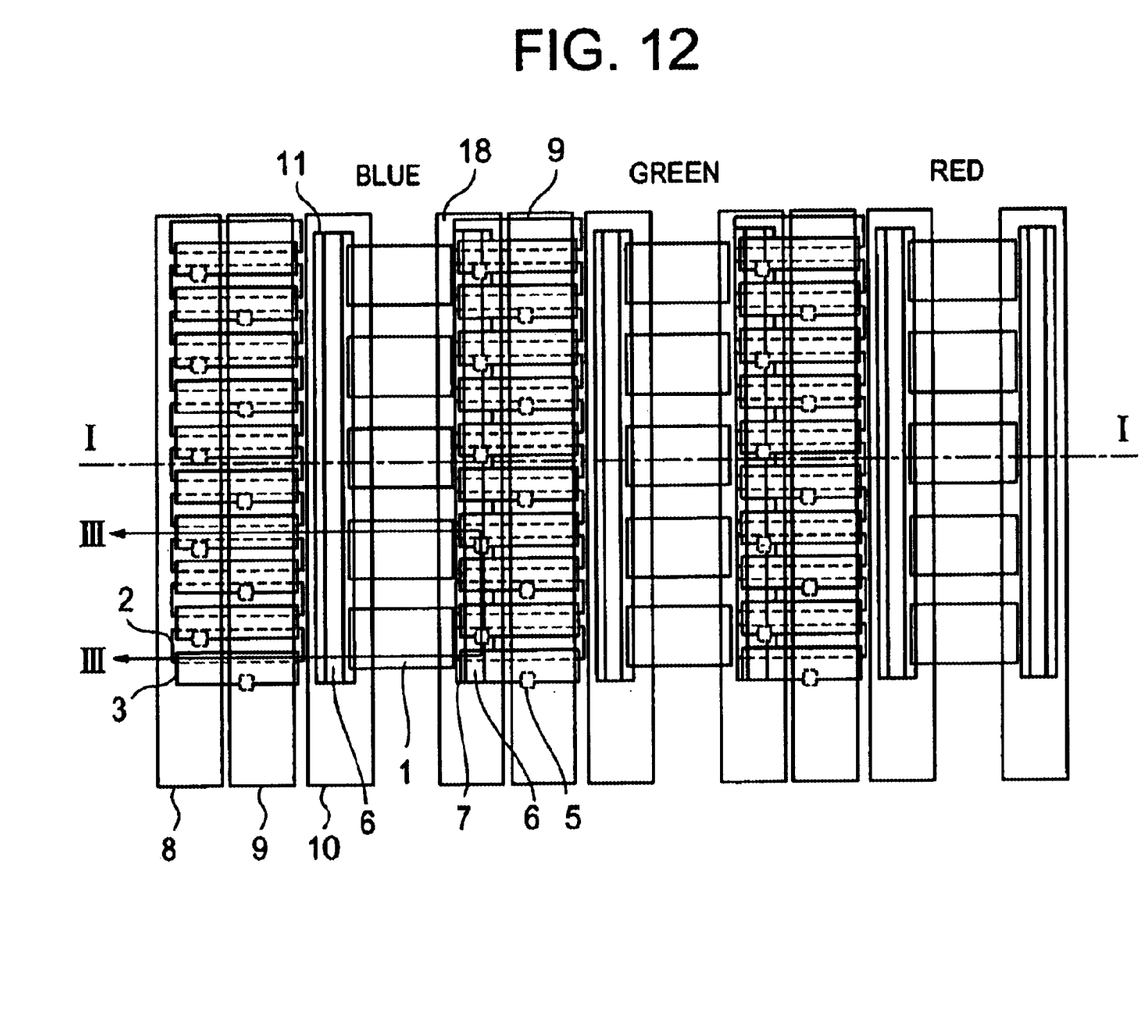
FIG. 12 is a plan view of a solid state image sensor according to a second embodiment of the invention.
Figure 13:
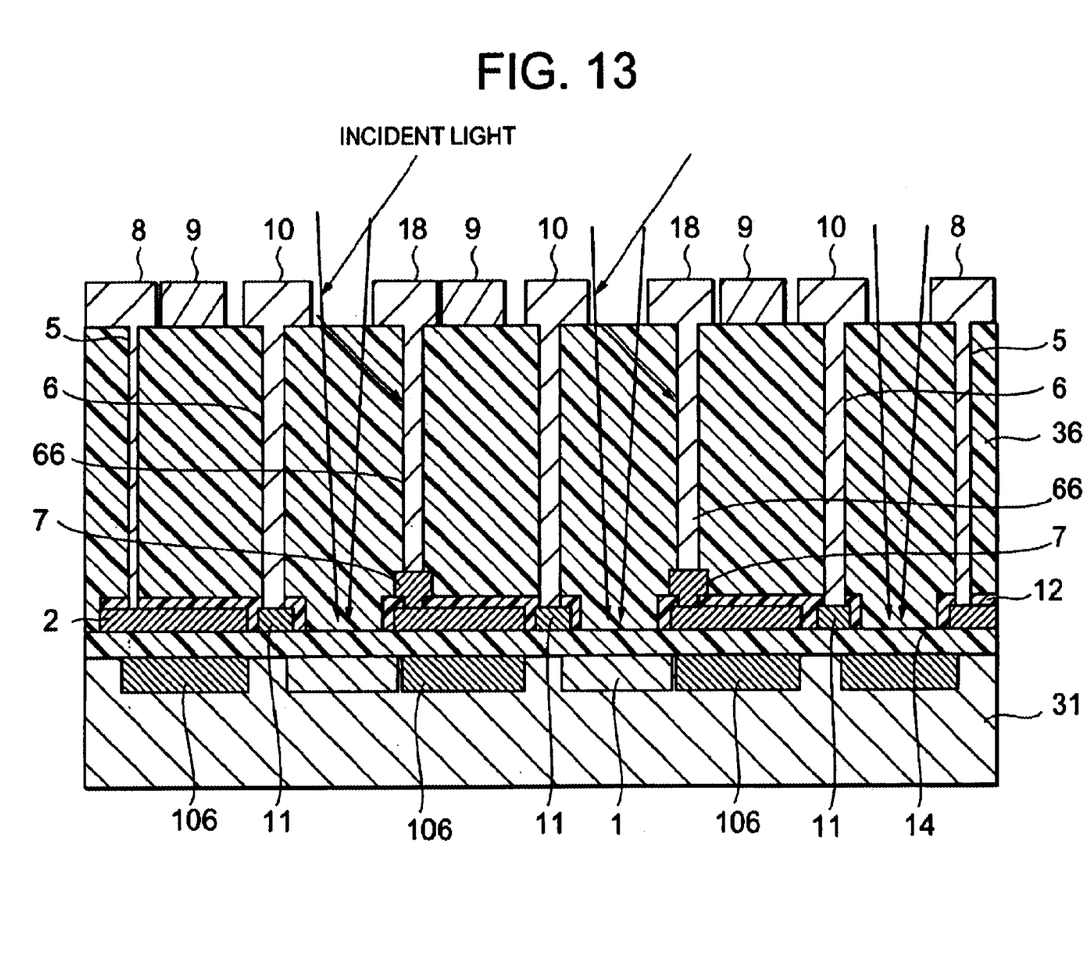
FIG. 13 is an enlarged cross sectional view taken along the line I—I of FIG. 12 and corresponding to a portion, enclosed by a dashed circle line, of the drawing of FIG. 12.
Figure 14:
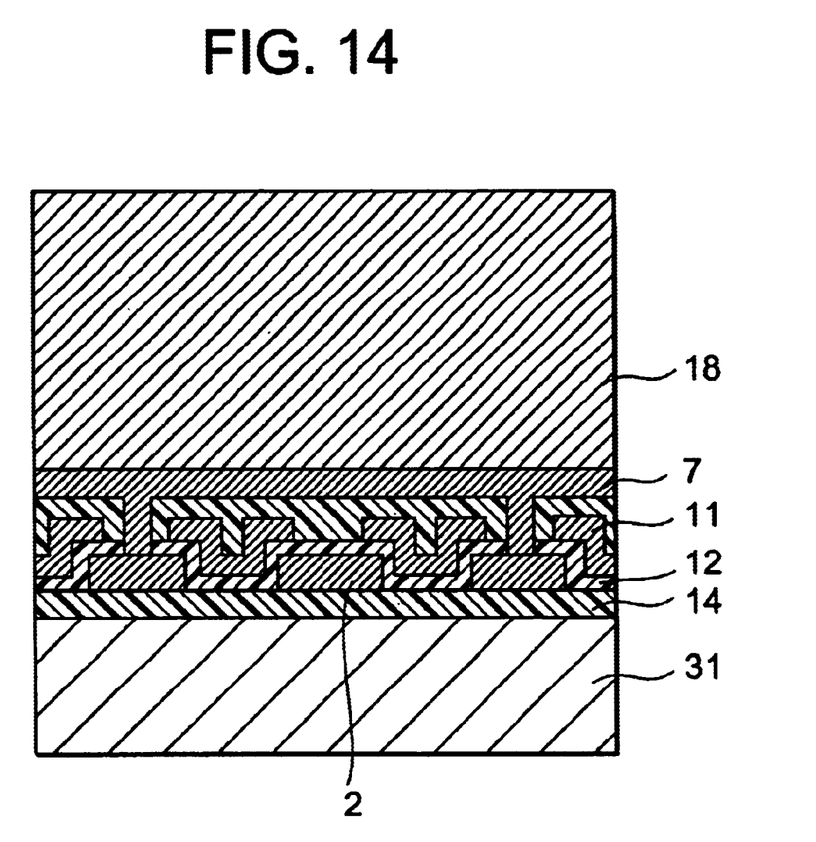
FIG. 14 is a cross sectional view taken along the line III—III of FIG. 12.

FIG. 12 is a plan view of a solid state image sensor including a plurality of linear image sensors, each having a single row of photodiodes, according to a second embodiment of the present invention. FIG. 13 is an enlarged cross sectional view taken along the line I—I of FIG. 12 and corresponding to a portion, enclosed by a dashed circle line, of the drawing of FIG. 12. FIG. 14 is a cross sectional view taken along the line III—III of FIG. 12.

Furthermore, though not depicted in the figures, the solid state image sensor is configured to have a boundary implanted with boron ions and positioned between photodiodes 1 so that electric charges generated within a certain photodiode by photo-electric conversion are not able to enter a photodiode adjacent to the certain photodiode. Additionally, color filters having one color different from other colors are formed so as to correspond to each of the plurality of linear image sensors.

The solid state image sensor of the embodiment is configured to have a light shielding electrode formed therein so that a light beam incident on one row of photodiodes 1 (i. e., one of the plurality of linear image sensors) never enters a charge transfer register corresponding to the one row of photodiodes 1. Simultaneously, the solid state image sensor is also configured to have a light shielding electrode formed therein so that a light beam incident on one row of photodiodes 1 never enters a charge transfer register corresponding to another row of photodiodes (i. e., another one of the plurality of linear image sensors) adjacent to the one row of photodiodes 1. The solid state image sensor of the second embodiment has the same configuration of a second polysilicon electrode 11 constituting a control gate electrode and a light shielding electrode 10 formed on the control gate electrode as that employed in the first embodiment. The second embodiment employs different configuration of a charge transfer electrode and a light shielding electrode formed thereon than that employed in the first embodiment.

The solid state image sensor of the second embodiment comprises: a semiconductor substrate 31; a photodiode 1 formed in the substrate 31; and a charge transfer channel 106 positioned next to the photodiode 1 (on the left side of the photodiode 1 in the figure) and corresponding to the photodiode 1. An oxide film 14 is formed on a surface of the semiconductor substrate 31. A first polysilicon electrode 2 and a second polysilicon 11 are formed on the oxide film 14 on the charge transfer channel 106. Furthermore, a second polysilicon electrode 11 used to retrieve electric charges generated within the photodiode 1 is formed between the photodiode 1 and the charge transfer channel 106. The first polysilicon electrode 2 and the second polysilicon electrode 11 formed above the charge transfer channel 106 are isolated from each other by an interlayer insulation film 12 for isolation of polysilicon layers.

Thereafter, another interlayer insulation film (not shown) for isolation of polysilicon layers is deposited to cover the second polysilicon electrode 11, and a third polysilicon layer is deposited thereon and then patterned to form a row-shaped third polysilicon electrode 7 on the charge transfer channel 106. The third polysilicon electrode 7 is connected to a second polysilicon electrode 11 to which the same signal as that applied to the third polysilicon electrode 7 is applied.

An interlayer insulation film 36 is formed covering the first polysilicon electrode 2, the second polysilicon electrode 11 and the third polysilicon electrode 7 formed as described above. Then, openings 5, 6 and 66 are formed in the interlayer insulation film 36 by opening the corresponding portions of the film 36 on the first polysilicon electrode 2, the second polysilicon electrode 11 and the third polysilicon electrode 7. Note that the openings 6, 66 are formed in parallel with the row of photodiodes 1 and provided in the form of a continuous one-piece opening.

The openings 5, 6 and 66 formed as described above are filled with a light shielding metal to form light shielding electrodes 8, 10 and 18 made of, for example, aluminum, which electrodes are extended on the interlayer insulation film 36 to also serve as an interconnect line on the film 36. The light shielding electrodes 10, 18 are formed in the interlayer insulation film 36 so as to penetrate the interlayer insulation film 36 in a direction of film thickness, forming a row-shaped light shielding wall. FIG. 14 shows the resulting construction. FIG. 14 is a cross sectional view taken along the line III—III of FIG. 12 and as can be seen from the figure, the light shielding electrode 18 is formed filling the opening 66 and formed along the opening 66 on the third polysilicon electrode 7 in a direction of the row. In this case, each of the light shielding electrodes 10, 18 serve as a light shielding wall that prevents a light beam incident on the photodiode 1 (or the row of photodiodes 1) from entering the charge transfer register corresponding to another photodiode (or another row of photodiodes 1) adjacent to the photodiode 1 (or the row of photodiodes 1). Moreover, each of the light shielding electrodes 10, 18 also prevents a light beam incident on the photodiode 1 (or the row of photodiodes 1) corresponding to one color from entering another photodiodes (or another row of photodiodes 1) positioned next to the photodiodes 1 (or the row of photodiodes 1) and corresponding to another color different from the one color. Needless to say, contrary to the aforementioned case, each of the light shielding electrodes 10, 18 prevents a light beam incident on another photodiodes 1 (or another row of photodiodes 1) corresponding to another color from entering the photodiodes (or the row of photodiodes 1) positioned next to another photodiodes 1 (or another row of photodiodes 1) and corresponding to the one color.

As described so far, according to the solid state image sensor of the present invention, the solid state image sensor is configured to include a plurality of linear image sensors arranged in a row, each linear image sensor having at least one row of photodiodes, and the plurality of linear image sensors are provided such that a light shielding wall is formed in the form of an one-piece metal plate and disposed between adjacent linear image sensors corresponding to individual colors. Accordingly, a light beam incident on a certain linear image sensor never enters another linear image sensor adjacent to the certain linear image sensor, i. e., never interferes with another light beam incident on another linear image sensor. This reduces a difference between the amounts of signal charges outputted from different linear image sensors and reduces a difference between electric signals outputted from the solid state image sensor, thereby suppressing smear.

What is claimed is:

1. A solid state image sensor comprising:

a linear image sensor having at least one row of photodiodes;

a photodiode array formed such that said linear image sensor includes a plurality of linear image sensors and said plurality of linear image sensors are arranged side by side;

an insulation film covering said photodiode array; and a light shielding conductive film formed to penetrate said insulation film in a direction of thickness of said insulation film and partition said plurality of linear image sensors into individual linear image sensors, said light shielding conductive film serving as a light shielding film.

2. The solid state image sensor according to claim 1, further comprising a charge transfer register disposed beside said at least one row of photodiodes and corresponding to said at least one row of photodiodes, wherein said light shielding conductive film serves as a wall to separate said at least one row of photodiodes and said charge transfer register from each other.

3. The solid state image sensor according to claim 1, wherein said plurality of linear image sensors arranged side by side are provided to correspond to individual colors to be displayed.

4. The solid state image sensor according to claim 2, further comprising a control gate electrode used to retrieve electric charges generated within said at least one row of photodiodes and disposed beside said at least one row of photodiodes, wherein said light shielding conductive film is connected to said control gate electrode.

5. The solid state image sensor according to claim 2, wherein said charge transfer register includes a charge transfer channel and a charge transfer electrode formed on said charge transfer channel and used to control a voltage potential appearing at said charge transfer channel, and said light shielding conductive film is connected to said charge transfer electrode.

* * * * *